(12) United States Patent
Chen et al.

(10) Patent No.: US 9,397,121 B2
(45) Date of Patent: Jul. 19, 2016

(54) ARRAY SUBSTRATE AND METHOD FOR MANUFACTURING THE SAME, DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Chuanbao Chen, Beijing (CN); Xiaobin Yin, Beijing (CN); Ji Li, Beijing (CN); Haiting Zhao, Beijing (CN)

(73) Assignees: BOE TECHNOLOGY GROUP CO., LTD. (CN); HEFEI BOE OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 14/416,433

(22) PCT Filed: May 30, 2014

(86) PCT No.: PCT/CN2014/078872
§ 371 (c)(1),
(2) Date: Jan. 22, 2015

(87) PCT Pub. No.: WO2015/090007
PCT Pub. Date: Jun. 25, 2015

(65) Prior Publication Data
US 2015/0370136 A1 Dec. 24, 2015

(30) Foreign Application Priority Data

Dec. 18, 2013 (CN) .......................... 2013 1 0699032

(51) Int. Cl.
*H01L 21/336* (2006.01)
*H01L 29/04* (2006.01)
(Continued)

(52) U.S. Cl.
CPC ........ *H01L 27/124* (2013.01); *G02F 1/134363* (2013.01); *H01L 21/77* (2013.01); *H01L 27/12* (2013.01); *H01L 29/4908* (2013.01); *H01L 2924/0002* (2013.01)

(58) Field of Classification Search
CPC ..................... H01L 27/124; G02F 1/134363
USPC .......... 438/283, 195, 176, 157; 349/141, 169; 257/72, 59
See application file for complete search history.

(56) References Cited

U.S. PATENT DOCUMENTS 6,222,599 B1    4/2001  Yoshida et al.
8,120,746 B2 *  2/2012  Shibahara ......... G02F 1/134363
                                                349/169
(Continued)

FOREIGN PATENT DOCUMENTS

CN          1696803 A       11/2005
CN        102169259 A        8/2011
(Continued)

OTHER PUBLICATIONS

Office Action in Chinese Patent Application No. 201310699032.0, dated Oct. 8, 2015.
(Continued)

*Primary Examiner* — Calvin Lee
(74) *Attorney, Agent, or Firm* — Baker Hostetler LLP

(57) ABSTRACT

The present disclosure provides an array substrate including a substrate, a plurality of pixel units arranged on the substrate. Each pixel unit includes a TFT, a first transparent electrode and a second transparent electrode which are insulated from each other, the first transparent electrode includes a plurality of strip electrodes, the second transparent electrode includes a first electrode portion and a second electrode portion, the second electrode portion electrically connects to the first electrode portion, the first electrode portion includes a plurality of strip electrodes, the strip electrodes of the first electrode portion and the strip electrodes of the first transparent electrode are arranged in a staggered manner, the second electrode portion is arranged on a layer different from that of the first transparent electrode and the first electrode portion.

20 Claims, 2 Drawing Sheets

(51) Int. Cl.
*H01L 27/12* (2006.01)
*H01L 29/49* (2006.01)
*H01L 21/77* (2006.01)
*G02F 1/1343* (2006.01)

(56) References Cited

U.S. PATENT DOCUMENTS

| | | | | |
|---|---|---|---|---|
| 8,570,476 B2* | 10/2013 | Lee | ................... | G02F 1/134363 349/141 |
| 9,086,604 B2* | 7/2015 | Liu | ................... | G02F 1/134363 257/49 |
| 2012/0154730 A1* | 6/2012 | Sakurai | ............. | G02F 1/134363 349/141 |

FOREIGN PATENT DOCUMENTS

| | | |
|---|---|---|
| CN | 102243401 A | 11/2011 |
| CN | 102789100 A | 11/2012 |
| CN | 102809854 A | 12/2012 |
| CN | 102830557 A | 12/2012 |
| CN | 103713438 A | 4/2014 |
| CN | 203607412 U | 5/2014 |
| KR | 20070001768 A | 1/2007 |

OTHER PUBLICATIONS

International Search Report and Written Opinion in PCT International Application No. PCT/CN2014/078872, dated Sep. 19, 2014.
Office Action in Chinese Patent Application No. 201310699032.0, dated Feb. 2, 2016.

* cited by examiner

ARRAY SUBSTRATE AND METHOD FOR MANUFACTURING THE SAME, DISPLAY DEVICE

CROSS-REFERENCE TO RELATED APPLICATION

This application is the U.S. national phase of PCT Application No. PCT/CN2014/078872 filed on May 30, 2014, which claims priority to Chinese Patent Application No. 201310699032.0 filed on Dec. 18, 2013, the disclosures of which are incorporated in its entirety by reference herein.

TECHNICAL FIELD

The present disclosure relates to the field of display technology, in particular to an array substrate and a method for manufacturing the same, a display device.

BACKGROUND

With industrial progress and process improvement of TFT, the advanced super dimension switch (AD-SDS, referring to ADS) wide viewing angle technology has been applied in more and more products, including telephones, digital cameras, tablet personal computers, laptops, liquid crystal televisions, and so on, its excellent display performance has been highly praised by more and more users, thus has a strong market competitiveness.

The ADS technology is: forming a multi-dimensional electric field by an electric field generated between edges of slot electrode in a same plane and an electric field generated between a slot electrode layer and a strip electrode layer, to make all aligned liquid crystal molecules located between the slot electrodes and over the electrode in a liquid crystal cell be able to generate a rotation, so as to improve liquid crystal work efficiency and increase light transmitting efficiency. The advanced super dimension switch can improve image quality of a thin film transistor-liquid crystal display (TFT-LCD) product, and make the TFT-LCD have advantages such as high resolution, high transmittance, low power consumption, wide viewing angle, high aperture ratio, low chromatic aberration, and having no push mura.

FIG. 1 and FIG. 2 are schematic views of an existing ADS array substrate. FIG. 2 is a cross-section view of FIG. 1 along an A-A' direction. As shown in FIG. 1 and FIG. 2, an electric filed in a pixel region of the existing ADS array substrate is mainly an electric field generated between a common electrode 14 and a pixel electrode 15. Since areas of the common electrode 14 and the pixel electrode 15 are limited, thus the resulting electric field in the pixel region is also limited, thereby causing rotation angles of the aligned liquid crystal molecules to be limited. Therefore, the display effect of the display device is disappointing.

SUMMARY

One technical object of the present disclosure is to provide an array substrate and a method for manufacturing the same as well as a display device, which can increase an electric field in a pixel region of the array substrate and improve the display effect of the display device.

To solve the above technical object, embodiments of the present disclosure provide following technical solutions:

On the one hand, an array substrate is provided and includes a substrate and a plurality of pixel units arranged on the substrate, wherein each of the plurality of pixel units includes a TFT, a first transparent electrode and a second transparent electrode which are insulated from each other; the first transparent electrode includes a plurality of strip electrodes, the second transparent electrode includes a first electrode portion and a second electrode portion, the second electrode portion is electrically connected to the first electrode portion, the first electrode portion includes a plurality of strip electrodes, the plurality of the strip electrodes of the first electrode portion and the plurality of strip electrodes of the first transparent electrode are arranged in a staggered manner, the second electrode portion is arranged on a layer different from that of the first transparent electrode and the first electrode portion.

Furthermore, the first electrode portion and the first transparent electrode are arranged on a same layer.

Furthermore, the first transparent electrode is electrically connected to a drain electrode of the TFT.

Furthermore, the substrate is further provided with a connection line for transmitting a common voltage signal and connecting second transparent electrodes of adjacent pixel units, the second transparent electrode is electrically connected to the connection line.

Furthermore, the second electrode portion of the second transparent electrode is directly connected to the connection line, the first electrode portion of the second transparent electrode is connected to the connection line through a via hole.

Furthermore, the second transparent electrode is electrically connected to a drain electrode of the TFT.

Furthermore, the first transparent electrode is applied with a common voltage signal.

Furthermore, a first electric field is generated between the first transparent electrode and the second electrode portion, and a second electric field is generated between the first transparent electrode and the first electrode portion.

One embodiment of the present disclosure further provides a display device, which includes the above array substrate.

One embodiment of the present disclosure further provide a method for manufacturing an array substrate, which includes:

forming a plurality of pixel units on a substrate, wherein each of the plurality of pixel units includes a TFT, a first transparent electrode and a second transparent electrode which are insulated from each other, the first transparent electrode includes a plurality of strip electrodes, the second transparent electrode includes a first electrode portion and a second electrode portion, the second electrode portion is electrically connected to the first electrode portion, the first electrode portion includes a plurality of strip electrodes, the plurality of the strip electrodes of the first electrode portion and the plurality of the strip electrodes of the first transparent electrode are arranged in a staggered manner, the second electrode portion is arranged on a layer different from that of the first transparent electrode and the first electrode portion.

Furthermore, the method further includes:

forming a connection line configured for transmitting a common voltage signal and connecting the second transparent electrodes of adjacent pixel units, wherein the second transparent electrode is electrically connected to the connection line.

Furthermore, the forming a connection line configured for transmitting a common voltage signal and connecting the second transparent electrodes of adjacent pixel units further includes:

forming the connection line directly connected with the second electrode portion of the second transparent electrode, and forming a via hole penetrating through an insulating layer, so that the connection line connects to the first electrode portion of the second transparent electrode through the via hole.

Embodiments of the present disclosure have following advantageous effects:

In the above technical solutions: each of the plurality of pixel units includes a TFT, a first transparent electrode and a second transparent electrode which are insulated from each other, the first transparent electrode includes a plurality of strip electrodes, the second transparent electrode includes a first electrode portion and a second electrode portion, the second electrode portion is electrically connected to the first electrode portion, the first electrode portion includes a plurality of strip electrodes, the plurality of the strip electrodes of the first electrode portion and the plurality of the strip electrodes of the first transparent electrode are arranged in a staggered manner; the first transparent electrode maybe electrically connected to a drain electrode of the TFT, serving as a pixel electrode, and the first electrode portion is used for receiving a common voltage signal; or, the second transparent electrode is electrically connected to the drain electrode of the TFT, serving as a pixel electrode, and the first transparent electrode is applied with a common voltage signal. In this way, when a display device including the above array substrate is working, an electric field in a pixel region includes two parts: one part is an electric field generated between the pixel electrode and the common electrode, and the other part is a horizontal electric field generated between the transparent electrode and the pixel electrode. Thus, by using the technical solutions according to embodiments of the present disclosure, the electric field in the pixel region of the array substrate may be increased, so as to improve the display effect of the display device.

DETAILED DESCRIPTION

To make the object, the technical solutions and the advantages of the present disclosure more apparent, detailed description will be made hereinafter in conjunction with drawings and embodiments.

Embodiments of the present disclosure provide an array substrate and a method for manufacturing the same as well as a display device, which can increase an electric field in a pixel region of the array substrate and improve the display effect of the display device.

Figure 1:
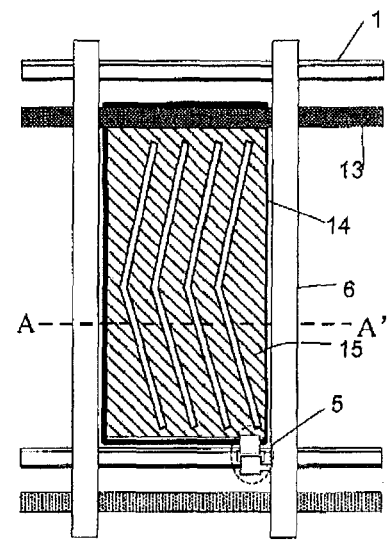
FIG. 1 is a schematic plan view of an existing array substrate.
Figure 2:
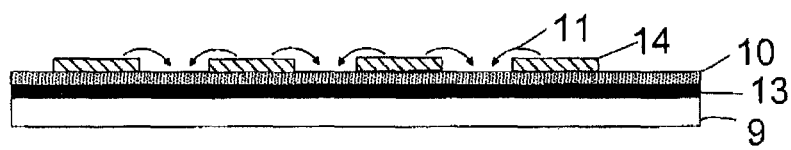
FIG. 2 is a schematic view showing an electric field in a pixel region in a cross-section of the existing array substrate along A-A' direction.
Figure 3:
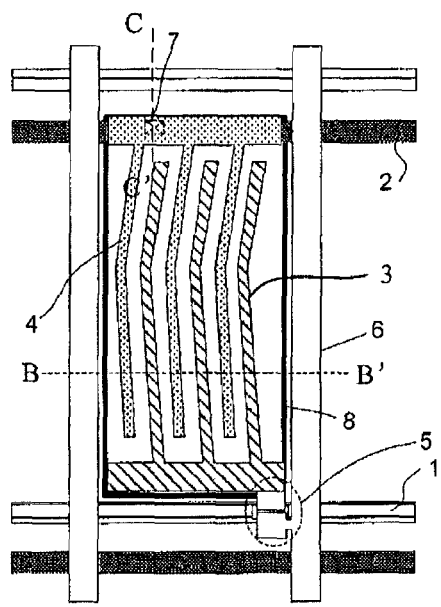
FIG. 3 is a schematic plan view of an array substrate according to one embodiment of the present disclosure.

One embodiment of the present disclosure provides an array substrate, including a substrate and a plurality of pixel units arranged on the substrate. FIG. 3 is a schematic plane view of an array substrate according to one embodiment of the present disclosure, and specifically is a schematic view of one pixel unit. Each of the plurality of pixel units includes a TFT 5, a first transparent electrode 3 and a second transparent electrode which are insulated from each other. The first transparent electrode includes a plurality of strip electrodes. The second transparent electrode includes a first electrode portion 4 and a second electrode portion 8. The second electrode portion 8 is electrically connected to the first electrode portion 4. The first electrode portion 4 includes a plurality of strip electrodes. The strip electrodes of the first electrode portion 4 and the strip electrodes of the first transparent electrode 3 are arranged in a staggered manner. The second electrode portion 8 is arranged on a layer different from that of the first transparent electrode 3 and the first electrode portion 4.

In the array substrate according to one embodiment of the present disclosure, each of the pixel units includes a TFT, a first transparent electrode and a second transparent electrode which are insulated from each other, the first transparent electrode includes a plurality of strip electrodes, the second transparent electrode includes a first electrode portion and a second electrode portion, the second electrode portion is electrically connected to the first electrode portion, the first electrode portion includes a plurality of strip electrodes, the strip electrodes of the first electrode portion and the strip electrodes of the first transparent electrode are arranged in a staggered manner. The first transparent electrode is electrically connected to a drain electrode of the TFT, and the first electrode portion is configured for receiving a common voltage signal; or, the second transparent electrode is electrically connected to the drain electrode of the TFT, serving as a pixel electrode, and the first transparent electrode is applied with the common voltage signal. In this way, when a display device including the above array substrate according to one embodiment of the present disclosure is working, an electric field in a pixel region includes two parts: one part is an electric field generated between the pixel electrode and the common electrode, the other part is a horizontal electric field generated between the transparent electrode and the pixel electrode. Thus, by using the technical solutions according to one embodiment of the present disclosure, the electric field in the pixel region of the array substrate may be increased, so as to improve the display effect of the display device.

Further, the first electrode portion 4 and the first transparent electrode 3 may be arranged on a same layer. Since the second electrode portion 8 is arranged on a layer different from that of the first transparent electrode 3 and the first electrode portion 4, thus the array substrate needs to be provided with a via hole for connecting the first electrode portion 4 and the second electrode portion 8.

Figure 4:
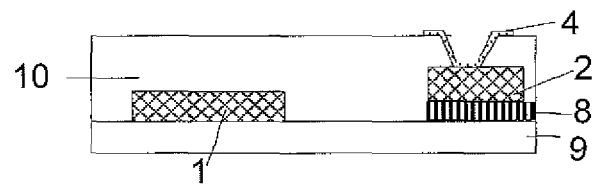
FIG. 4 is a schematic cross-section view of the array substrate along C-C' direction according to one embodiment of the present disclosure.

In one embodiment of the present disclosure, the first transparent electrode 3 is electrically connected to the drain electrode of the TFT, serving as a pixel electrode of the display device; the second transparent electrode includes the first electrode portion 4 which is arranged on a same layer with the first transparent electrode 3, and the second electrode portion 8 which is arranged on a layer different from that of the first transparent electrode 3. As shown in FIG. 3, the array substrate is further provided with a connection line 2 for transmitting a common voltage signal and connecting the second transparent electrodes of adjacent pixel units. The second transparent electrode is electrically connected to the connection line 2. Specifically, as shown in FIG. 4, the second electrode portion 8 of the second transparent electrode is directly connected to the connection line 2, since the first electrode portion 4 of the second transparent electrode and the second electrode portion 8 are arranged on different layers, thus the first electrode portion 4 needs to be connected with the connection line 2 through a contact via hole 7 which penetrates through an insulating layer.

Figure 5:
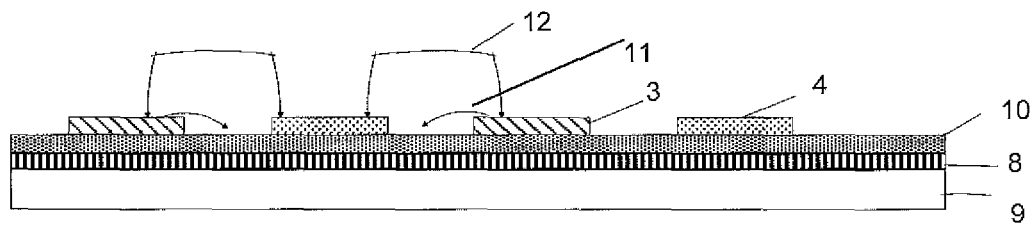
FIG. 5 is a schematic view showing an electric field in a pixel region in a cross-section of the array substrate along B-B' direction according to one embodiment of the present disclosure.

The first electrode portion 4 and the second electrode portion 8 of the second transparent electrode may be used for receiving a common voltage signal; when the display device is working, the first transparent electrode 3 serves as a pixel electrode, the first electrode portion 4 and the second electrode portion 8 serve as common electrodes. As shown in FIG. 5, the electric field in the pixel region of the array substrate according to one embodiment includes two parts: one part is a first electric field 11 generated between the first transparent electrode 3 and the second electrode portion 8, the other part is a second electric field 12 generated between the first transparent electrode 3 and the first electrode portion 4. Comparing with the electric field in the pixel region of the existing array substrate, the electric field in the pixel region according to one embodiment increases the second electric field 12 generated between the first transparent electrode 3 and the first electrode portion 4, so as to increase the electric field in the pixel region of the array substrate.

Figure 6:
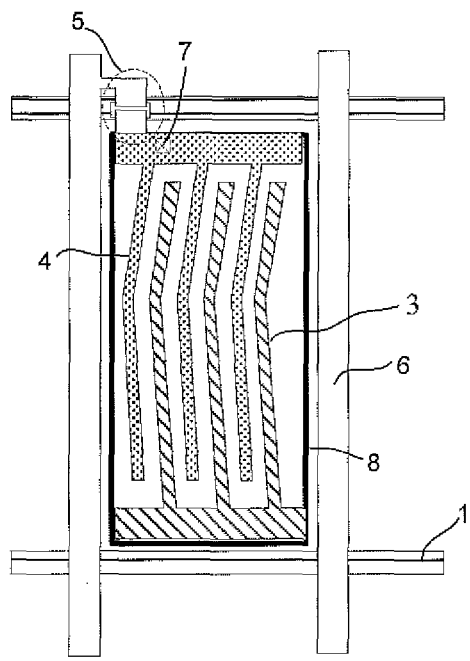
FIG. 6 is a schematic plan view of an array substrate according to another embodiment of the present disclosure.

In another embodiment of the present disclosure, as shown in FIG. 6, the first transparent electrode 3 serves as a common electrode, for receiving a common voltage signal; the second transparent electrode is electrically connected to the drain electrode of the TFT 5, serving as a pixel electrode of the display device; the second transparent electrode includes the first electrode portions 4 which are arranged on a same layer with the first transparent electrodes 3 in a staggered manner, and the second electrode portion 8 which is arranged on a layer different from that of the first transparent electrode 3, the first electrode portion 4 is connected to the second electrode portion 8 through the contact via hole 7 which penetrates through an insulating layer. Of course, in one embodiment, a connection line may also be provided for connecting adjacent first transparent electrodes; or, when manufacturing the first transparent electrodes, the first transparent electrodes and the connection line may be formed from material of the transparent electrodes through a one-time patterning process, and the connection line is directly connected the first transparent electrodes of adjacent pixel units, then the via hole may be not manufactured and thus the process is simplified.

The electric field in the pixel region of the array substrate according to one embodiment includes two parts: one part is an electric field generated between the first transparent electrode 3 and the second electrode portion 8, and the other part is an electric field generated between the first transparent electrode 3 and the first electrode portion 4. Comparing with the electric field in the pixel region of the existing array substrate, the electric field in the pixel region according to one embodiment increases the electric field generated between the first transparent electrode 3 and the first electrode portion 4, so as to increase the electric field in the pixel region of the array substrate.

One embodiment of the present disclosure further provides a display device, including the above array substrate. The array substrate has a same structure as that of the above embodiments, which is omitted herein for brevity. In addition, structures of other parts in the display device may refer to the related art, which are also not described herein. The display device may be any products or components having a display function such as: a liquid crystal panel, an electronic paper, a liquid crystal television, a liquid crystal display, a digital frame, a telephone, and a tablet personal computer.

One embodiment of the present disclosure further provides a method manufacturing an array substrate, which includes:

forming a plurality of pixel units on a substrate in such a manner that, each of the pixel units includes a TFT, a first transparent electrode and a second transparent electrode which are insulated from each other, the first transparent electrode includes a plurality of strip electrodes, the second transparent electrode includes a first electrode portion and a second electrode portion, the second electrode portion is electrically connected to the first electrode portion, the first electrode portion includes a plurality of strip electrodes, the strip electrodes of the first electrode portion and the strip electrodes of the first transparent electrode are arranged in a staggered manner, the second electrode portion is arranged on a layer different from that of the first transparent electrode and the first electrode portion.

In the array substrate according to one embodiment of the present disclosure, each of the plurality of pixel units includes a TFT, a first transparent electrode and a second transparent electrode which are insulated from each other, the first transparent electrode includes a plurality of strip electrodes, the second transparent electrode includes a first electrode portion and a second electrode portion, the second electrode portion is electrically connected to the first electrode portion, the first electrode portion includes a plurality of strip electrodes, the strip electrodes of the first electrode portion and the strip electrodes of the first transparent electrode are arranged in a staggered manner, the first transparent electrode is electrically connected to the drain electrode of the TFT, serving as a pixel electrode, and the first electrode portion is used to receive a common voltage signal; or, the second transparent electrode is electrically connected to the drain electrode of the TFT, serving as a pixel electrode, and the first transparent electrode is applied with a common voltage signal. In this way, when a display device including the above array substrate according to one embodiment of the present disclosure is working, the electric field in the pixel region includes two parts: one part is an electric field generated between the pixel electrode and the common electrode, and the other part is a horizontal electric field generated between the transparent electrode and the pixel electrode. Thus, by using the technical solution according to one embodiment of the present disclosure, the electric field in the pixel region of the array substrate may be increased, so as to improve the display effect of the display device.

Further, the method further includes:

forming a connection line configured for transmitting a common voltage signal and connecting second transparent electrodes of adjacent pixel units, the second transparent electrode being electrically connected to the connection line.

Further, the forming a connection line configured for transmitting a common voltage signal and connecting second transparent electrodes of adjacent pixel units further includes:

forming the connection line directly connected with the second electrode portion of the second transparent electrode, and forming a via hole penetrating an insulating layer, so that the connection line is connected to the first electrode portion of the second transparent electrode through the via hole.

The array substrate and the method for manufacturing the same are described in details hereinafter in conjunction with FIG. 3 to FIG. 5 and specific examples by taking followings as an example, i.e., the first transparent electrode and the first electrode portion are arranged on a passivation layer; when a display device is working, the first transparent electrode serves as a pixel electrode, and the first electrode portion and the second electrode portion of the second transparent electrode serve as common electrodes.

The method for manufacturing the array substrate according to one embodiment of the present disclosure includes following steps:

Step 1: providing a base substrate 9, and forming a pattern of a second electrode portion 8 on the base substrate 9 by a one-time patterning process;

The base substrate 9 may be a glass substrate or a quartz substrate. Specifically, a transparent conductive layer having a thickness of about 300 to about 1500 Å is deposited on the base substrate 9 by using a magnetron sputtering method, a thermal evaporation method or other methods for forming a film. The transparent conductive layer may be ITO (indium tin oxide) or IZO (indium zinc oxide). A photoresist layer is coated on the transparent conductive layer; the photoresist layer is exposed by using a mask, so that a photoresist-unremained area and a photoresist-remained area are formed in the photoresist layer, the photoresist-remained area corresponds to an area where the pattern of the second electrode portion 8 locates, the photoresist-unremained area corresponds to an area outside the above pattern; the photoresist in the photoresist-unremained area is totally removed through a developing process, while a thickness of the photoresist in the photoresist-remained area remains unchanged; the transparent conductive layer in the photoresist-unremained area is totally removed by an etching process; after stripping off residual photoresist, the pattern of the second electrode portion 8 is formed.

Step 2: forming a Pattern Including a Gate Electrode, a Gate Line 1 and a connection line 2 on the base substrate 9 after the step 1 by a one-time patterning process;

Specifically, a gate metal layer having a thickness of 2500 Å to 16000 Å may be deposited on the base substrate 9 after the step 1 by using a sputtering method or a thermal evaporation method. The gate metal layer may be made from metals such as Cu, Mo, Cr, Nd, Ni, Mn, Ti and W or an alloy of these metals. The gate metal layer may be a single-layer structure or a multi-layer structure, and the multi-layer structure for example may be Cu/Mo, Ti/Cu/Ti, and so on. A photoresist layer is coated on the gate metal layer, and the photoresist layer is exposed by using a mask so that a photoresist-unremained area and a photoresist-remained area are formed in the photoresist layer. The photoresist-remained area corresponds to an area where the pattern including the gate electrode, the gate line 1 and the connection line 2 locate, and the photoresist-unremained area corresponds to an area outside the above pattern. The photoresist in the photoresist-unremained area is totally removed by a developing process, while a thickness of the photoresist in the photoresist-remained area remains unchanged. The gate metal film in the photoresist-unremained area is totally removed by an etching process; after stripping off residual photoresist, the pattern including the gate electrode, the gate line 1 and the connection line 2 is formed. The connection line 2 is used for transmitting a common voltage signal and connecting second electrode portions 8 of adjacent pixel units.

Step 3: forming a gate insulating layer on the base substrate 9 after the step 2 by a one-time patterning process, and forming a pattern of an active layer on the gate insulating layer;

Specifically, a gate insulating layer having a thickness of about 2000 Å to about 6000 Å may be deposited on the base substrate 9 after the step 2 by using a plasma enhanced chemical vapor (PECVD) method. Material of the gate insulating layer may be selected from oxide, nitride or oxynitride. The gate insulating layer may be a single-layer, a double-layer or a multi-layer structure. Specifically, the gate insulating layer may be $SiN_x$, $SiO_x$ or $Si(ON)_x$.

A photoresist layer is coated on the gate insulating layer; the photoresist layer is exposed by using a mask, so that a photoresist-unremained area and a photoresist-remained area are formed in the photoresist layer. The photoresist-remained area corresponds to an area where the pattern of the gate insulating layer locates, and the photoresist-unremained area corresponds to an area outside the above pattern. The photoresist in the photoresist-unremained area is totally removed by a developing process, while a thickness of the photoresist in the photoresist-remained area remains unchanged. The gate insulating layer in the photoresist-unremained area is totally removed by an etching process, after stripping off residual photoresist, the pattern of the gate insulating layer including a contact via hole 7 is formed.

Then, a semiconductive layer having a thickness of about 20 Å to about 1000 Å is deposited on the insulating layer by using a magnetron sputtering method, a thermal evaporation method or other methods for forming a film. Specifically, the semiconductive layer may be made from amorphous silicon. A photoresist layer is coated on the semiconductive layer and the photoresist layer is exposed and developed; then, the semiconductive layer is etched and the photoresist is stripped off, the pattern of the active layer made from the semiconductive layer is formed.

Step 4: forming a pattern including a data line 6, a source electrode and a drain electrode on the base substrate 9 after the step 3 by a one-time patterning process;

Specifically, a source-drain metal layer having a thickness of about 2000 Å to about 6000 Å is deposited on the base substrate 9 after the step 3 by using a magnetron sputtering method, a thermal evaporation method or other methods for forming a film. The source-drain metal layer may be made from metals such as Cu, Mo, Cr, Nd, Ni, Mn, Ti and W, or an alloy of these metals. The source-drain metal layer may be a single-layer structure or a multi-layer structure. The multi-layer structure for example may be Cu/Mo, Ti/Cu/Ti, and so on. A photoresist layer is coated on the source-electrode metal layer, and the photoresist layer is exposed by using a mask, so that a photoresist-unremained area and a photoresist-remained area are formed in the photoresist layer. The photoresist-remained area corresponds to an area where the pattern including the data line 6, the source electrode and the drain electrode locates, and the photoresist-unremained area corresponds to an area outside the above pattern. The photoresist in the photoresist-unremained area is totally removed by a developing process, while a thickness of the photoresist in the photoresist-remained area remains unchanged. The source-drain metal film in the photoresist-unremained area is totally removed by an etching process; after stripping off residual photoresist, the pattern including the data line 6, the source electrode and the drain electrode is formed. The source electrode, the drain electrode and the gate electrode constitute the TFT 5.

Step 5: forming a pattern of a passivation layer 10 including a via hole and a contact via hole 7 on the base substrate 9 after the step 4 by a one-time patterning process;

Specifically, the passivation layer having a thickness of 400 to 5000 Å is deposited on the base substrate 9 after the step 4 by using a magnetron sputtering method, a thermal evaporation method, a PECVD method or other methods for forming a film. Material of the passivation layer may be selected from oxide, nitride or oxynitride. Specifically, the passivation layer may be $SiN_x$, $SiO_x$ or $Si(ON)_x$. The passivation layer may be a single-layer structure, or may be a double-layer structure consisting of silicon nitride and silicon oxide.

A photoresist layer is coated on the passivation layer; the photoresist layer is exposed by using a mask, so that a photoresist-unremained area and a photoresist-remained area are formed in the photoresist layer. The photoresist-remained area corresponds to an area where the pattern of the passivation layer locates, and the photoresist-unremained area corresponds to an area outside the above pattern. The photoresist in the photoresist-unremained area is totally removed by a developing process, while a thickness of the photoresist in the photoresist-remained area remains unchanged. The passivation layer in the photoresist-unremained area is totally removed by an etching process, after stripping off residual photoresist, the pattern of the passivation layer 10 including the via hole and the contact via hole 7 is formed.

In one example, the first electrode portion 4 and the second electrode portion 8 are arranged on different layers; in order to achieve a connection between the first electrode portion 4 and the second electrode portion 8, the contact via hole 7 needs to be formed in the gate insulating layer and the passivation layer, so as to achieve the connection between the first electrode portion 4 and the second electrode portion 8. As shown in FIG. 4, in a specific example, the first electrode portion 4 is connected to the second electrode portion 8 through a connection line 2.

Step 6: forming a pattern including a first transparent electrode 3 and a first electrode portion 4 on the base substrate 9 after the step 5 by a one-time patterning process.

The first transparent electrode 3 is connected to a drain electrode, serving as a pixel electrode. The first electrode portion 4 is connected to the connection line 2 through the contact via hole 7, for receiving a common voltage signal. Specifically, a transparent conductive layer having a thickness of 300 Å to 1500 Å is deposited on the base substrate 9 after the step 5 by using a magnetron sputtering method, a thermal evaporation method or other methods for forming a film. The transparent conductive layer may be ITO or IZO. A photoresist layer is coated on the transparent conductive layer, and the photoresist layer is exposed by using a mask, so that a photoresist-unremained area and a photoresist-remained area are formed in the photoresist layer. The photoresist-remained area corresponds to the pattern of the first transparent electrode 3 and the pattern of the first electrode portion 4, and the photoresist-unremained area corresponds to an area outside the above pattern. The photoresist in the photoresist-unremained area is totally removed by a developing process, while a thickness of the photoresist in the photoresist-remained area remains unchanged. The transparent conductive layer in the photoresist-unremained area is totally removed by an etching process, after stripping off residual photoresist, the pattern of the first transparent electrode 3 and the pattern of the first electrode portion 4 are formed. The first transparent electrode 3 is connected to the drain electrode through the via hole, and the first electrode portion 4 is connected to the connection line 2 through the contact via hole 7.

The array substrate shown as FIG. 3 to FIG. 5 may be manufactured according to the above steps 1 to 6. In the array substrate of one example, the first transparent electrode 3 and the first electrode portion 4 are arranged on the passivation layer. In a optional example, as shown in FIG. 3, in order to make the electric field in the pixel region more uniform, the first transparent electrode 3 includes a plurality of strip electrodes, the first electrode portion 4 includes a plurality of strip electrodes, the first transparent electrodes 3 and the first electrode portions 4 are arranged on the passivation in a staggered manner. The connection line 2 transmits the common voltage signal. The second electrode portion 8 is directly connected to the connection line 2. The first electrode portion 4 is connected to the connection line 2 through the contact via hole 7. As shown in FIG. 5, when the display device is working, a first electric field 11 is generated between the first transparent electrode 3 and the second electrode portion 8, meanwhile, a second electric field 12 is generated between the first transparent electrode 3 and the first electrode portion 4, which may play a role in cooperatively increasing the electric field in the pixel region, so as to make all aligned liquid crystal molecules in the liquid crystal cell being able to rotate, and improve the display effect of the display device.

The above are merely optional embodiments of the present disclosure. It should be noted that, a person skilled in the art may further make improvements and modifications without departing from the principle of the present disclosure, and these improvements and modifications shall also be considered as the scope of the present disclosure.

What is claimed is:

1. A method for manufacturing an array substrate, comprising:
forming a plurality of pixel units on a substrate, wherein each of the plurality of pixel units comprises a TFT, a first transparent electrode and a second transparent electrode which are insulated from each other, the first transparent electrode comprises a plurality of strip electrodes, the second transparent electrode comprises a first electrode portion and a second electrode portion, the second electrode portion is electrically connected to the first electrode portion, the first electrode portion comprises a plurality of strip electrodes, the strip electrodes in the first electrode portion and the strip electrodes of the first transparent electrode are arranged in a staggered manner, the second electrode portion is arranged on a layer different from the first transparent electrode and the first electrode portion.

2. The method according to claim 1, further comprising:
forming a connection line configured for transmitting a common voltage signal and connecting the second transparent electrodes of adjacent pixel units, wherein the second transparent electrode is electrically connected to the connection line.

3. The method according to claim 2, wherein the forming a connection line configured for transmitting a common voltage signal and connecting the second transparent electrodes of adjacent pixel units further comprises:
forming the connection line directly connected to the second electrode portion of the second transparent electrode, and forming a via hole penetrating through an insulating layer, so that the connection line is connected to the first electrode portion of the second transparent electrode through the via hole.

4. An array substrate, comprising a substrate and a plurality of pixel units arranged on the substrate; wherein each of the plurality of pixel units comprises a TFT, a first transparent electrode and a second transparent electrode which are insulated from each other; the first transparent electrode comprises a plurality of strip electrodes, the second transparent electrode comprises a first electrode portion and a second electrode portion, the second electrode portion is electrically connected to the first electrode portion, the first electrode portion comprises a plurality of strip electrodes, the strip electrodes of the first electrode portion and the strip electrodes of the first transparent electrode are arranged in a staggered manner, the second electrode portion is arranged on a layer different from the first transparent electrode and the first electrode portion.

5. The array substrate according to claim 4, wherein a first electric field is generated between the first transparent electrode and the second electrode portion, and a second electric field is generated between the first transparent electrode and the first electrode portion.

6. The array substrate according to claim 4, wherein the second transparent electrode is electrically connected to a drain electrode of the TFT.

7. The array substrate according to claim 6, wherein the first transparent electrode is applied with a common voltage signal.

8. The array substrate according to claim 4, wherein the first transparent electrode is electrically connected to a drain electrode of the TFT.

9. The array substrate according to claim 8, wherein the substrate is further provided with a connection line for transmitting a common voltage signal and connecting the second transparent electrodes of adjacent pixel units, the second transparent electrode is electrically connected to the connection line.

10. The array substrate according to claim 9, wherein the second electrode portion of the second transparent electrode is directly connected to the connection line, the first electrode portion of the second transparent electrode are connected to the connection line through a via hole.

11. The array substrate according to claim 4, wherein the first electrode portion and the first transparent electrode are arranged on a same layer.

12. The array substrate according to claim 11, wherein the first transparent electrode is electrically connected to a drain electrode of the TFT.

13. The array substrate according to claim 11, wherein the second transparent electrode is electrically connected to a drain electrode of the TFT.

14. A display device, comprising an array substrate, wherein the array substrate comprises a substrate and a plurality of pixel units arranged on the substrate; wherein each of the plurality of pixel units comprises a TFT, a first transparent electrode and a second transparent electrode which are insulated from each other; the first transparent electrode comprises a plurality of strip electrodes, the second transparent electrode comprises a first electrode portion and a second electrode portion, the second electrode portion is electrically connected to the first electrode portion, the first electrode portion comprises a plurality of strip electrodes, the strip electrodes of the first electrode portion and the strip electrodes of the first transparent electrode are arranged in a staggered manner, the second electrode portion is arranged on a layer different from the first transparent electrode and the first electrode portion.

15. The display device according to claim 14, wherein a first electric field is generated between the first transparent electrode and the second electrode portion, and a second electric field is generated between the first transparent electrode and the first electrode portion.

16. The display device according to claim 14, wherein the first electrode portion and the first transparent electrode are arranged on a same layer.

17. The display device according to claim 16, wherein the second transparent electrode is electrically connected to a drain electrode of the TFT.

18. The display device according to claim 16, wherein the first transparent electrode is electrically connected to a drain electrode of the TFT.

19. The display device according to claim 18, wherein the substrate is further provided with a connection line for transmitting a common voltage signal and connecting the second transparent electrodes of adjacent pixel units, the second transparent electrode is electrically connected to the connection line.

20. The display device according to claim 19, wherein the second electrode portion of the second transparent electrode is directly connected to the connection line, the first electrode portion of the second transparent electrode is connected to the connection line through a via hole.

* * * * *